United States Patent [19]

Laermer et al.

[11] Patent Number: 5,501,893
[45] Date of Patent: Mar. 26, 1996

[54] METHOD OF ANISOTROPICALLY ETCHING SILICON

[75] Inventors: Franz Laermer, Stuttgart; Andrea Schilp, Schwäbisch Gmünd, both of Germany

[73] Assignee: Robert Bosch GmbH, Stuttgart, Germany

[21] Appl. No.: 284,490

[22] PCT Filed: Nov. 27, 1993

[86] PCT No.: PCT/DE93/01129

§ 371 Date: Aug. 5, 1994

§ 102(e) Date: Aug. 5, 1994

[87] PCT Pub. No.: WO94/14187

PCT Pub. Date: Jun. 23, 1994

[30] Foreign Application Priority Data

Dec. 5, 1992 [DE] Germany ............................ 42 41 045.2

[51] Int. Cl.$^6$ ................................. C25F 3/12; B44C 1/22
[52] U.S. Cl. ................................. 428/161; 216/67; 216/79
[58] Field of Search ................................. 156/625, 635, 156/646, 645

[56] References Cited

U.S. PATENT DOCUMENTS

| | | | |
|---|---|---|---|
| 4,579,623 | 4/1986 | Suzuki et al. | 156/626 |
| 4,784,720 | 11/1988 | Douglas | 156/643 |
| 4,790,903 | 12/1988 | Sugano et al. | 156/643 |
| 4,855,017 | 8/1989 | Douglas | 156/643 |
| 5,320,241 | 4/1994 | Cathey, Jr. | 156/664 |

FOREIGN PATENT DOCUMENTS

| | | |
|---|---|---|
| 0200951 | 12/1986 | European Pat. Off. . |
| 0363982 | 4/1990 | European Pat. Off. . |
| 0383570 | 8/1990 | European Pat. Off. . |
| 0497023 | 8/1992 | European Pat. Off. . |
| 3613181 | 10/1987 | Germany . |
| 3706127 | 1/1989 | Germany . |
| 3940083 | 6/1991 | Germany . |
| 4202447 | 7/1992 | Germany . |
| 4204848 | 8/1992 | Germany . |
| 03129820 | 6/1991 | Japan . |
| 88/09830 | 12/1988 | WIPO . |

OTHER PUBLICATIONS

Mahi et al: "The etching of silicon in diluted $SF_6$ plasmas: Correlation between the flux of incident species and the etching kinetics". In: Journal of Vacuum Science and Technology, vol. 5, No. 3, 1987, pp. 657–666.

Tin et al: "Effects of RF Bias on Remote Microwave Plasma assisted Etching of Silicon in $SF_6$" In: Journal of the Electrochemical Society, vol. 138, No. 10, Oct. 1991, pp. 3094–3100.

DE3613181A–Abstract–Oct. 22, 1987.
DE3940083A–Abstract–Jun. 13, 1991.
DE4202447A–Abstract–Jul. 30, 1992.

*Primary Examiner*—W. Robinson H. Clark
*Attorney, Agent, or Firm*—Spencer & Frank

[57] ABSTRACT

A method of anisotropic plasma etching of silicon to provide laterally defined recess structures therein through an etching mask employing a plasma, the method including anisotropic plasma etching in an etching step a surface of the silicon by contact with a reactive etching gas to removed material from the surface of the silicon and provide exposed surfaces; polymerizing in a polymerizing step at least one polymer former contained in the plasma onto the surface of the silicon during which the surfaces that were exposed in a preceding etching step are covered by a polymer layer thereby forming a temporary etching stop; and alternatingly repeating the etching step and the polymerizing step. The method provides a high mask selectivity simultaneous with a very high anisotropy of the etched structures.

26 Claims, 1 Drawing Sheet

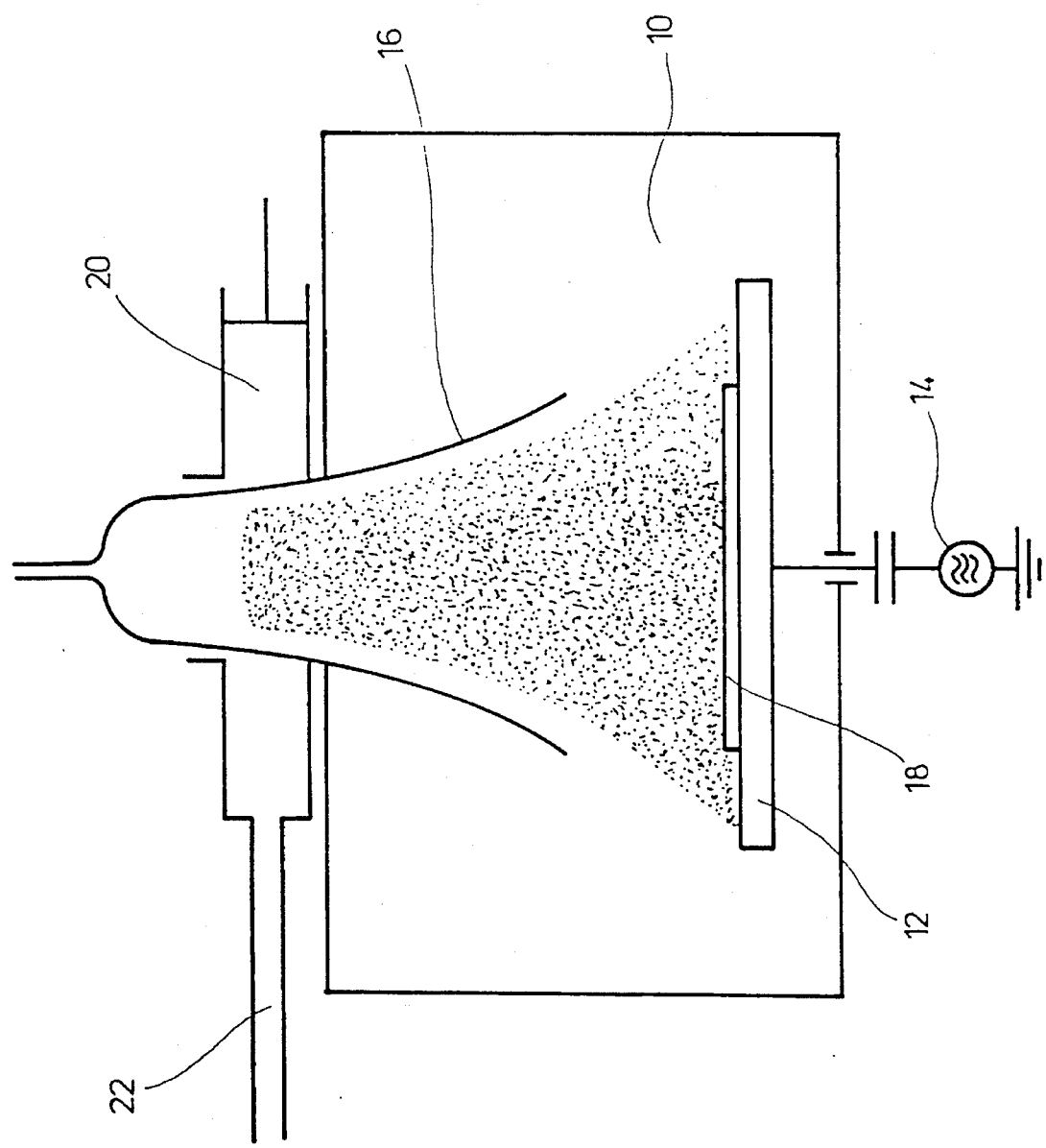

METHOD OF ANISOTROPICALLY ETCHING SILICON

BACKGROUND OF THE INVENTION

1. Field of the Invention

The invention relates to a method of anisotropically etching structures preferably defined with an etching mask, particularly laterally exactly defined recesses in silicon by means of a plasma.

2. Description of the Related Art

It is known to anisotropically etch defined structures, for example trenches, crests, tongues, flexible ridges or the like having low to average selectivity, into silicon substrates.

The individual structures to be etched in are usually defined by the etching masks applied to the silicon substrate by way of so-called masking layers, for example, a photoresist layer.

In the anisotropic etching technique, it is necessary to achieve a laterally exactly defined recess in the silicon. These deeply-extending recesses must have lateral ends which are as exactly vertical as possible. The edges of the masking layers covering those silicon substrate regions that are not supposed to be etched are not underetched in order to keep the lateral precision of the structural transition from the mask into the silicon as high as possible. As a result, it is necessary to allow the etching to progress only on the bottom of the structures, but not on the already produced side walls of the structures.

To this end, it has already been proposed to use a plasma-etching method to perform etching of profiles in silicon substrates. In this method chemically reactive species and electrically-charged particles (ions) are generated in a reactive gas mixture in a reactor with the aid of an electric discharge. The positively-charged cations generated in this manner are accelerated toward the substrate by means of an electrical prestress applied to the silicon substrate, and fall virtually vertically onto the substrate surface, and promote the chemical reaction of the reactive plasma species with the silicon on the etching base.

Because of the nearly vertical fall of the cations, etching should progress correspondingly slowly toward the side walls of the structures, e.g., in the optimum case, not at all.

It is known to use non-dangerous and process-stable reactive gases based on fluorochemicals. However, in this case it is very disadvantageous that these reactive gases acting on a fluorochemical basis permit a very high etching rate and a very high selectivity, but display a markedly isotropic etching behavior.

In comparison to the silicon, the fluorine radicals generated in the plasma have such a high spontaneous reaction rate that the structure edges (lateral surfaces) are etched quickly, thus resulting in undesired underetching of the mask edges.

Moreover, it has already been proposed to cover the side walls with polymer formers which are located in the plasma at the same time during etching, and to protect the walls by means of this polymer film. Because this polymer film would also form on the etching base, a stable fall of ions should keep this film free from polymer and permit etching there. However, associated with this is the disadvantage that the polymer formers added to the plasma, which are partly formed from the fluorine carrier itself or through the splitting of fluorine radicals, or which result from purposely added, unsaturated compounds or eroded, organic mask material photoresist), occur as recombination partners with respect to the fluorine radicals. By means of this back reaction, the objective of which is a chemical equilibrium, a considerable portion of the fluorine required for etching is neutralized, while at the same time a corresponding component of the polymer formers required for side wall passivation is lost. Because of this, the etching rate that can be attained with this method is markedly reduced.

This dependence of the etching fluorine radicals on the unsaturated polymer formers in the plasma makes the etching rates and the etching profiles dependent on the free silicon substrate surface to be etched. Furthermore, it is disadvantageous that the unsaturated species present in the plasma that result in the polymer formers preferably etch certain mask materials and thus cause the selectivity, that is, the ratio of the silicon etching rate to the mask etching rate, to worsen. Furthermore, if a non-uniform side wall protection occurs, the side walls are preferably coated directly at the mask edge with polymer, and thus the side wall is better protected in this area than in the progressive etching depth of the structures.

In this instance the polymer covering of the side walls decreases rapidly at greater depths, and an underetching occurs there with the consequence that bottle-type etching profiles result.

Instead of using reactive gases based on fluorine, it has already been proposed to use reactive gases based on other halogens, particularly chlorine and bromine, which have less avidity, or reactive gases that release chlorine or bromine in plasma.

Because their radicals formed in plasma exhibit a significantly lower spontaneous reaction with silicon, and first lead to etching with simultaneous ion support, these reactive gases offer the advantage that they essentially etch only on the bottom of the structure, and not on the side walls of the structure, because the ions impact virtually vertically on the silicon substrate. The disadvantage exists, however, that these reactive Oases react in an extraordinarily sensitive manner with respect to moisture.

In this case, not only are costly transfer devices necessary for the silicon substrates in the reactor, but also the leakage rate of the entire etching system must be kept extremely low. Even the slightest occurrence of reactor moisture leads to microroughness on the bottom of the silicon etching due to local silicon oxidation, and thus to a complete breakdown in etching.

The object of the invention is to create a method of the generic type with which a high anisotropic etching of silicon substrate can be achieved with fluorochemicals with simultaneous high selectivity.

SUMMARY OF THE INVENTION

According to the invention, the object is accomplished in that the anisotropic etching process is performed separately in separate, respectively alternatingly sequential etching and polymerization steps.

As a consequence of performing anisotropic etching in separate, respectively alternating sequential etching and polymerization steps, in an advantageous manner the simultaneous presence of etching species and polymer formers in the plasma is avoided altogether. Hence, deep structures having vertical edges can be realized with very high etching rates in silicon substrates.

Further advantageous embodiments of the invention ensue from the features disclosed in the dependent claims.

By means of the method of the invention, during the etching step no consideration need be given to a specific ratio of saturated to unsaturated species, that is, of fluorine radicals to polymer formers, so that the actual etching step can be optimized with respect to the etching rate and selectivity without the anisotropy of the total process being adversely affected.

In an advantageous embodiment of the invention, the silicon substrates are bombarded with ionic energy during the etching steps and, alternatively, also during the polymerization steps. By means of this simultaneous bombardment with ionic energy, it is advantageously accomplished that no polymer can form on the etching base, so that a higher etching rate can be achieved during the etching step, because a prior, necessary decomposition of the polymer layer on the etching base is no longer required.

It has been shown that a very good anisotropic result can be achieved with extraordinarily low ionic energy. As a consequence of the only low required ionic energy, an outstanding mask selectivity can be achieved.

Because the high etching rates that are possible through the method of the invention lead to a strongly exothermic reaction of fluorine radicals with silicon, considerable warming of the silicon substrate can ensue.

In an advantageous manner, the silicon substrate is cooled during the etching process, preferably by a helium gas current. By means of the simultaneous cooling of the silicon substrate during the etching process, the advantages of the method of the invention, namely a very high etching rate with simultaneously high selectivity, can be fully utilized.

BRIEF DESCRIPTION OF THE DRAWING

The invention is described in detail below in conjunction with a drawing which schematically shows the design of an etching device that can be used for the method.

DESCRIPTION OF THE PREFERRED EMBODIMENTS

The FIGURE shows an etching chamber 10, in which a substrate electrode 12 connected to a high-frequency supply 14 is disposed.

Furthermore, a Surfatron 16 projects into the etching chamber 10. A silicon substrate 18 is disposed on the substrate electrode 12 in the working region of the Surfatron 16. The Surfatron 16 is coupled with a resonator 20 for microwave plasma stimulation. The system further has a waveguide for feeding a reactive gas.

The method of the invention of anisotropically etching silicon substrate is performed in the following manner.

For the sake of an overview, individual references to the etching chamber 10, in which the method steps take place, are omitted in the following method description.

The etching chamber 10 is also only selected by way of example, and the invention does not relate in detail to the concrete structure of the etching chamber 10. The method of the invention can, of course, be performed with an analogous device that completes the individual method steps.

A correspondingly prepared silicon substrate, that is, a silicon substrate coated with an etching mask, for example of photoresist, with the etching mask leaving free the regions of the silicon substrate that are intended to be anisotropically etched, is subjected to a first etching step.

For this purpose a mixture of, for example, sulfur hexafluoride $SF_2$ and argon Ar, is used, which has a gas flow of between 0 and 100 sccm and a processing pressure between 10 and 100 μbar. In this instance, the plasma generation preferably takes place with a microwave irradiation at outputs between 300 and 1200W (2.45 GHz).

At the same time, a substrate prestress for ion acceleration is applied to the substrate electrode. The substrate prestress is preferably between 5 and 30V, and can be achieved with a high-frequency supply (13.56 MHz) at outputs between 2 and 10W.

During the etching step, chemically reactive species and electrically-charged particles (ions) are generated in the reactor—here Surfatron—with the aid of an electrical discharge in the mixture of sulfur hexafluoride and argon.

The positively-charged cations generated in this way are accelerated toward the silicon substrate by means of the electric prestress applied to the substrate electrode, and fall nearly vertically onto the substrate surface left free by the etching mask, and support the chemical reaction of the reactive plasma species with the silicon.

The etching step can be performed so long that, for example, an etching depth of approximately 2–3 μm depth is achieved.

Subsequently, a first polymerization step is performed with a mix of, for example, trifluoromethane $CHF_3$ and argon Ar. The mixture in this instance preferably has a gas flow of from 0 to 100 sccm and a process pressure between 10 and 100 μbar. At an output preferably between 300 and 1200W, a microwave irradiation and thus a plasma are generated by means of the resonator.

During the polymerization step, the surfaces exposed during the previous etching step, that is, the etching base and the side surfaces, are covered with a polymer. This polymer layer forms a very effective provisional etching stop on the etching edges or etching surfaces.

The polymer respectively applied to the etching edge in the polymerization step is partially re-stripped during the second etching step which now follows. During the etching step, the edge exposed during further etching already locally experiences an effective protection, by means of the polymer partially stripped from the edge region located opposite, from a further etching attack.

In the method of the invention, the known tendency of released monomers to precipitate so as to be directly contiguous to one another again has the positive consequence of effecting an additional local edge protection during further etching. The result of this is that the anisotropy of the individual etching steps, which are effected separately from the polymerization steps in the plasma, is significantly increased by this effect.

The polymer layer applied to the etching base during the polymerization step is rapidly broken through during the subsequent etching step, because the polymer is stripped very quickly with the ion support, and the chemical reaction of the reactive plasma species with the silicon can progress on the etching base.

During the etching step, the side walls of the structures to be etched in remain protected by the polymer applied during the polymerization step.

The etching steps and the polymer steps are repeated alternatingly until the predetermined etching depth of the structures in the silicon substrate is reached. In the microwave-supported method, which permits an etching rate of between 2 and 20 μm/min, the duration of the individual etching steps remains such that, for example, 2 to 3 µm depth is further etched per etching step.

The following polymerization step is selected to be approximately so long that, during the polymerization time, an approximately 50 nm thick, Teflon-like polymer layer has precipitated on the side walls or on the etching base. A time of, for example, one minute is required for this.

In an advantageous embodiment of the polymerization step, an ionic effect on the silicon substrate is performed simultaneously with the application of the polymer. For this the substrate electrode is acted upon by a high-frequency output of, for example, 3 to 5W, which results in a substrate prestress of approximately 5V. Because the polymer layers that precipitated during the polymerization step without the ionic effect are only very slowly etched—only a few nanometers per minute—during the etching step, the simultaneous ion effect during the etching step offers the advantage that the polymer etching rate can be drastically increased to over 100 nm/min. This is even achieved when the silicon substrate is bombarded with a low ionic energy, e.g., 5 eV.

If the silicon substrate is already bombarded with low ionic energy during the polymerization steps, absolutely no polymer can be formed on the etching base. The monomers capable of polymerization therefore preferably build up on the side walls, and provide a particularly effective protection there against the subsequent etching step, whereas the etching base remains free from any covering.

During the subsequent etching step, therefore, further etching can take place on the etching base without delay, that is, without prior stripping of a polymer film.

With the two alternatives, that is, ionic effect only during the etching phase or the ionic effect during the etching phase or ion effect during the polymerization phase, structure having very high anisotropy, that is, having practically exactly vertical edge profiles, can be attained.

It is a particular preference that an anisotropic result can be achieved with extraordinarily low ionic energies. Should no polymer be deposited on the etching base during the polymerization step, ionic energies of only approximately 5 eV are sufficient. During the etching steps, an ion bombardment with energies between 5 and 30 eV are recommended in order to leave the structure base completely free from deposits from the plasma, so that no roughness of the etching base can be established at first.

If ions are only accelerated toward the silicon substrate during the etching steps, these are also sufficient to break through, within a few seconds, the etching base polymer that deposits during the polymerization steps. In this operating mode, the microloading effect in the etching rate is further reduced.

Due to the high spontaneous reaction rate of fluorine radicals with silicon, the silicon etching per se requires no ion support.

A further, essential advantage ensues from the fact that an outstanding mask selectivity is achieved as a consequence of the only low required ionic energies. Ionic energies of the disclosed magnitude are not sufficient to induce the etching of the mask materials, e.g., photoresist and silicon oxide, $SiO_2$, because the activation energy for breaking chemical bonds in the high-grade cross-linked mask polymer is considerably higher. Without a prior breaking of these bonds, it is not possible for the etching species to react with the mask materials to form volatile compounds which can subsequently be desorbed.

Because high etching rates can be achieved with the described method, a warming of the silicon substrate comes about by means of the strongly exothermic chemical reaction of fluorine radicals with silicon. At correspondingly high temperatures, the polymers deposited during the polymerization steps, or also the mask materials, e.g., photoresist, lose their resistance to the etching species. Therefore, it is necessary to assure sufficient cooling of the silicon substrates. This is accomplished with methods known per se, e.g., the cooling of the rear side of the silicon substrate by means of a helium gas current, or adhesion of the silicon substrates onto cooled silicon electrodes.

Instead of the described mixtures of sulfur hexafluoride and argon for the etching steps, or of trifluoromethane and argon for the polymerization steps, other common etching gases that release fluorine, for example, nitrogen trifluoride $NF_3$, tetrafluoromethane $CF_4$ or the like, can be used just as well for the etching steps, and mixtures based on perfluorinated aromatic substances having suitable peripheral groups, for example, perfluorinated, styrene-like monomers or ether-like fluorine compounds are used for the polymerization steps.

In all media used, the single crucial point is achieving high densities of reactive species and ions with simultaneous low, but precisely controllable, energy, with which the generated ions reach the substrates.

The ionic energy must be kept as low as possible with consideration for a high mask selectivity. High ionic energies would additionally lead to interfering reactions of material that dispersed or was stripped and redeposited uncontrolled. The energy of the ions acting on the silicon substrate must be sufficient, however, to keep the structure base free from deposits, so that a smooth etching base can be obtained.

What is claimed is:

1. A method of anisotropic plasma etching of silicon to provide laterally defined recess structures therein through an etching mask employing a plasma, the method comprising:

a. anisotropic plasma etching in an etching step a surface of the silicon by contact with a reactive etching gas to removed material from the surface of the silicon and provide exposed surfaces;

b. polymerizing in a polymerizing step at least one polymer former contained in the plasma onto the surface of the silicon during which the surfaces that were exposed in a preceding etching step are covered by a polymer layer thereby forming a temporary etching stop; and c. alternatingly repeating the etching step and the polymerizing step.

2. The method according to claim 1, wherein the polymerization steps are controlled independently of one another.

3. The method according to claim 1, wherein the etching steps are performed without the presence of polymer formers in the plasma.

4. The method according to claim 1, wherein a polymer layer applied during the polymerization step to the laterally defined recess structures is partially restripped during an immediately subsequent etching step.

5. The method according to claim 1, wherein etching removes material from the surface of the silicon to a preselected etching depth, and wherein the etching steps are performed over a preselected period of time which provides the preselected etching depth.

6. The method according to claim 1, wherein polymerizing polymer formers contained in the plasma onto the surface of the silicon provides a polymer layer having a preselected thickness, and wherein the polymerization steps are performed over a preselected period of time which provides the preselected thickness.

7. The method according to claim 1, wherein the silicon is bombarded by an ionic energy during the etching steps.

8. The method according to claim 1, wherein the silicon is alternatingly bombarded by an ionic energy during the polymerization steps.

9. The method according to claim 1, wherein the silicon is bombarded by an ionic energy during the etching steps, and wherein the ionic energy ranges between 1 and 50 eV during the etching steps.

10. The method according to claim 9, wherein the ionic energy ranges between 5 and 30 eV during the etching steps.

11. The method according to claim 1, wherein the silicon is bombarded by an ionic energy during the polymerization steps, and wherein, during the polymerization steps, the ionic energy ranges between 1 and 10 eV.

12. The method according to claim 11, wherein the ionic energy ranges between 4 and 6 eV.

13. The method according to claim 12, wherein the ionic energy is 5 eV.

14. The method according to claim 1, wherein the reactive etching gas is at least one gas that releases fluorine.

15. The method according to claim 1, wherein the reactive etching gas is a mixture of sulfur hexafluoride, $SF_6$, and argon, Ar.

16. The method according to claim 1, wherein the at least one polymer former contained in the plasma is at least one hydrofluorocarbon.

17. The method according to claim 16, wherein the at least one hydrofluorocarbon has a low fluorine-to-carbon ratio.

18. The method according to claim 1, wherein the at least one polymer former contained in the plasma is a mixture of trifluoromethane, $CHF_3$, and argon, Ar.

19. The method according to claim 1, wherein the etching steps and polymerization steps employ the recited respective media have gas flows ranging from 0 to 100 sccm and processing pressures ranging from 10 to 100 μbar.

20. The method according to claim 1, wherein the plasma is generated with microwave irradiation at an output ranging between 100 and 1500 W.

21. The method according to claim 1, wherein the plasma is generated with microwave irradiation at an output ranging between 300 and 1200 W.

22. The method according to claim 1, wherein the silicon is cooled during at least one of the etching steps and the polymerization steps.

23. The method according to claim 1, wherein the silicon has a rear side, and wherein the rear side of the silicon is acted upon by a helium gas current.

24. The method according to claim 1, wherein a cooled substrate electrode is provided with a thermal contact material, and wherein the silicon is positioned on the thermal contact material.

25. The method according to claim 1, wherein the etching steps and polymerization steps are preformed with a high plasma density of reactive species and ions.

26. The method according to claim 1, wherein the plasma density and the ionic energy are controlled independently of one another.

* * * * *